United States Patent
Mostov et al.

(10) Patent No.: US 7,386,075 B2
(45) Date of Patent: Jun. 10, 2008

(54) APPARATUS FOR AND METHOD OF OPTIMIZING THE PERFORMANCE OF A RADIO FREQUENCY RECEIVER IN THE PRESENCE OF INTERFERENCE

(75) Inventors: Alexander Mostov, Rishon Letzion (IL); Oren Eliezer, Sde-Varburg (IL)

(73) Assignee: Texas Instruments Incorporated, Dallas, TX (US)

( * ) Notice: Subject to any disclaimer, the term of this patent is extended or adjusted under 35 U.S.C. 154(b) by 389 days.

(21) Appl. No.: 11/178,925

(22) Filed: Jul. 12, 2005

(65) Prior Publication Data

US 2006/0040630 A1    Feb. 23, 2006

(51) Int. Cl.
*H04L 27/08* (2006.01)

(52) U.S. Cl. ............... 375/345; 330/130; 330/131; 330/135; 330/136; 330/254; 330/278; 330/299

(58) Field of Classification Search ............. 330/278, 330/130–131, 135–136, 254, 299; 375/345
See application file for complete search history.

(56) References Cited

U.S. PATENT DOCUMENTS

| 5,490,179 A | 2/1996 | Ong ........................ 375/345 |
| 5,589,791 A | 12/1996 | Gilbert ................... 327/359 |
| 5,722,061 A | 2/1998 | Hutchison et al. ....... 455/245.1 |
| 5,722,062 A * | 2/1998 | Nakanishi et al. ....... 455/247.1 |
| 6,035,008 A | 3/2000 | Kim ......................... 375/345 |
| 6,175,279 B1 | 1/2001 | Ciccarelli et al. ......... 330/296 |
| 6,298,221 B1 | 10/2001 | Nguyen .................... 455/73 |
| 6,343,221 B1 | 1/2002 | Toda et al. ................ 455/553 |
| 6,498,926 B1 | 12/2002 | Ciccarelli et al. ......... 455/240.1 |

OTHER PUBLICATIONS

"RF Design Guide: systems, circuits and equations", Peter Vizmuller, Artech House, Inc. 1995, pp. 30=37, 182-189.
"RF Mixer Terminology", M/A-COM RF, Microwave and Millimeter Wave Databook, 1994, pp. 6-33-6-36.
PCS CDMA Low Noise Amplifier/Mixer 1500 MHZ Downconverter RF Micro Devices Handbook, pp. 8-69-8=73, 1999.

* cited by examiner

*Primary Examiner*—Curtis Odom
(74) *Attorney, Agent, or Firm*—Wade James Brady, III; Frederick J. Telecky, Jr.

(57) ABSTRACT

An apparatus for and method of extending the dynamic range of a RF communications receiver. The invention provides a mechanism for controlling the gain of both the LNA and down conversion mixer in the front end portion of an RF receiver. Both the LNA and the mixer are adapted to have both low and high gain modes of operation. The control mechanism typically comprises a two bit gain control that places both the LNA and mixer in one of four operating gain mode states. The selection of the most appropriate operating gain mode state, is preferably determined in accordance with various metrics such as the received levels of the desired signal, levels of interference signals, bit error rate and receiver RSSI.

7 Claims, 7 Drawing Sheets

APPARATUS FOR AND METHOD OF OPTIMIZING THE PERFORMANCE OF A RADIO FREQUENCY RECEIVER IN THE PRESENCE OF INTERFERENCE

FIELD OF THE INVENTION

The present invention relates generally to communications receiver circuits and more particularly relates to an apparatus for and method of optimizing the Radio Frequency (RF) receiver performance in the presence of interfering signals.

BACKGROUND OF THE INVENTION

High frequency radio frequency (RF) communications are becoming more and more prevalent in the world today. Products touting wireless RF communication links are becoming increasingly popular among consumers. A multitude of new products including redesigned existing ones is being built with wireless RF links today. A RF link is based on a transmitter that emits a RF signal representing the information sent, and a communication receiver that receives the transmitted signal and extracts the information transmitted therefrom. To do this, modern RF receivers use an assortment of components such as amplifiers, filters, mixers, detectors, VCOs, PLLs, etc. A common goal in designing a receiver is to achieve high sensitivity and a low noise figure while maintaining interference rejection capabilities.

Typically, various types of potential interference must be considered, some being out of band signals, which may be suppressed by filtering means, and some being in-band signals which are not suppressed by the band filtering commonly placed at the input to the receiver, and therefore reach the receiver's active elements.

A block diagram illustrating a conventional prior art superheterodyne receiver front end is shown in FIG. 1. The receiver, generally referenced 10, comprises an antenna 12 coupled to the input of a band pass filter (BPF) 13. The output of the BPF 13 is then amplified by an RF amplifier 14. The RF amplifier is commonly constructed so as to be tunable over a range of frequencies. The output of the RF amp is then converted (heterodyned or mixed) by mixer 16. The mixer comprises a circuit that forms the product of two analog waveforms that contains the sum and difference frequencies of the signals at its inputs. The mixer thus functions to convert RF energy at one frequency to a second frequency. Mixers are commonly used in receiver front ends to convert input RF signal frequencies to lower intermediate frequencies. They are also, used in other circuit components such as upconverters, modulators, phase detectors, frequency synthesizers, etc.

The mixing action performed by a mixer is achieved by multiplying an input signal with a second signal, usually a local oscillator signal. The output comprises two signals at the sum and difference frequencies as shown below in Equation 1.

$$\cos\omega_1 t \cos\omega_2 t = \frac{1}{2}\cos(\omega_1 + \omega_2)t + \frac{1}{2}\cos(\omega_1 - \omega_1)t \quad (1)$$

One of the two output signals is the desired signal and is termed the intermediate frequency (IF). For example, the IF may be the difference frequency while the sum frequency is suppressed (i.e. filtered out) using a low pass filter. Additional frequencies, however, other than the sum and difference frequencies, are also generated by the mixer due to the use of nonlinear elements (e.g., diodes) to perform the multiplication. The nonlinearities of these components cause the generation of the additional frequencies.

A schematic diagram illustrating a typical prior art mixer circuit is shown in FIG. 2. The mixer circuit, generally referenced 30, comprises a mixer core made up of a differential amplifier including transistors Q1 and Q2. A local oscillator 34 drives the bases of transistors Q1 and Q2. Load resistors R1 and R2 are coupled between the supply voltage and the collectors of Q1 and Q2, respectively. The IF output signal is taken from the collectors of Q1 and Q2. The RF input signal is applied to the base of Q4 via coupling capacitor C1. The base of Q4 is biased by current source 32 in series with transistor Q3.

In operation, transistors Q3 and Q4 form a current mirror since the bases of both transistors are connected together. The circuit is configured such that Q1 and Q2 are biased in the nonlinear region at very low current near cutoff. For the mixer to operate, the current through Q1 and Q2 must be set accurately. Thus, Q1, Q2 and Q3, Q4 must be constructed as matched pairs of transistors.

Since the bases of Q3 and Q4 are tied together and the emitters of both are tied to ground, the current through one transistor must be duplicated in the other. This will be the case if both transistors are well matched since both will have the same $V_{BE}$ voltage drop. Consequently, the collector current will be the same through both transistors. To enable the mixing function, the constant current source 32 is configured to supply an amount of current such that both Q1 and Q2 are biased near cutoff.

In the absence of any RF input signal, the IF output signal is proportional to the local scillator signal 34. The gain of the output is set by the two load resistors R1, R2 When the RF input signal is applied, the base voltage of Q3 and Q4 changes in accordance with the input signal. A rise in base voltage causes the current through Q3 and Q4 to increase. This causes the current flowing through Q1 and Q2 to increase. Transistors Q1 and Q2 now operate in a higher beta region. The change in the gain of the transistors causes a change in the IF output signal. Similarly, when the RF input decreases, the base voltage of Q3, Q4 also decreases. This causes a decrease in the current flowing through Q1 and Q2. Transistors Q1, Q2 now operate in a lower beta region causing a change in the output IF signal.

The nonlinear change in operating region, caused by the changes in the RF input signal, provides the mixing function whereby the desired sum and difference frequencies are generated. In addition, undesired intermodulation products are also produced. A narrow post mixer filter serves to remove most of the unwanted signals.

The generation of spurious output frequencies in a mixer is the result of using nonlinear switching elements to perform the multiplication function. Even when the input signal comprises a single frequency, the number of products generated may be large. The situation is compounded when the input signal comprises a plurality of frequencies as in various common scenarios of wireless reception.

A figure of merit that is indicative of the ability of a mixer to suppress intermodulation products is its third order intercept point, usually expressed in dBm. The intercept point is a measure of the linearity of a circuit or system permitting the calculation of distortion or intermodulation product levels from the amplitude of the input signal. An example graph illustrating the third order intercept for a mixer is shown in FIG. 3.

The desired signal component response (or $1^{st}$ order linear response) is shown as line 40 (above the noise level 44) while the undesired $3^{rd}$ order intermodulation components are shown in line 42. The two lines meet at a point 46 (usually beyond the 1 dB compression point). Assume two signals, having frequencies $f_1$ and $f_2$, are input to the receiver. The signal output of the mixer includes $3^{rd}$ order interfering components (line 42) having frequencies $2 f_1$-$1 f_2$ and $2 f_2$-$1 f_1$. Note that these components are termed $3^{rd}$ order due to the combination of a second harmonic and a fundamental. Since these frequency components are likely in the pass band, it is desirable to have as high a $3^{rd}$ order intercept value as possible, which corresponds to high linearity and low levels of intermodulation products.

The theoretical input intercept point represents the input amplitude at which the desired signal components and the undesired signal components (i.e., third order distortion products) are equal in amplitude. Stated differently, the intercept point is arrived at by extrapolating measured data to yield an input RF level at which the IF level and intermodulation products would be equal.

The order of the intercept point determines the slope at which the amplitudes of the distortion products increase with an increase in the input level. For the case of the third intercept point (referred to as IP3), the intermodulation products increase in amplitude by 3 dB when the input signal is raised by 1 dB. The IP3 determines the amount of intermodulation distortion produced in the receiver itself when subjected to high-level interference. Note that a mixer having a high intercept point generates low intermodulation distortion products.

Further, the dynamic range of a receiver (i.e., the ability of the receiver to handle a wide range of levels of received signal and interference) is affected by the linearity of the RF receiver stages, such as the LNA, mixer, filters, detectors, etc. To improve the performance of the receiver, the dynamic range of the receiver must be widened by designing receiver stages having as high a $3^{rd}$ order intercept point (IP3) as possible. In silicon integrated circuit (IC) design, however, a higher intercept point typically results in a higher Noise Figure (NF).

An amount of harmonics and intermodulation products are typically generated when two or more signals are input to the receiver due to the nonlinear elements in the receiver. It is desirable to design a receiver so as to minimize these products that degrade the receiver's performance.

The mixer that typically follows an LNA stage, having a gain in the order of 10 to 20 dB, is typically the component in the receiver most sensitive to nonlinearities. This is because it lies after the LNA wherein the signals are at a higher amplitude level having been amplified by the LNA. In addition, assuming a multi-channel FM receiver, any filters that lie before the mixer and/or the LNA must be fairly wide to accommodate the frequency range of channels the receiver must be able to handle. For example, many wireless systems operating in the 2.4 GHz ISM band must cover a frequency band of about 100 MHz. Such a wide input band permits not just the desired signal to enter the receiver but a large amount of undesired signals as well. Sources of undesired signals in the input frequency band of such a receiver include emissions from microwave ovens and various wireless transmissions in the 2.4 GHz ISM band. The fine tuning in such a receiver is not performed before the mixer but after it. The local oscillator signal input to the mixer is varied to correspond to the frequency of the desired received signal, while the channel selection filtering is performed by a fixed narrowband band pass filter after the mixer stage. Thus, the entire 100 MHz frequency band is constantly input to the mixer regardless of the desired received frequency.

The goal of the receiver design is to obtain the lowest noise figure possible while obtaining the highest $3^{rd}$ order intercept possible. These goals, however, conflict with one another. To achieve a low noise figure, the gain of the LNA must be set high. In this case, large levels of noise and undesirable signals enter the mixer and discriminator due to the requirement of receiving all the channels in the band.

A common solution to this problem is to control the gain of the LNA thus adapting it to the level of the received desired signal and the relative level of interference present. A variable gain LNA is used typically having two gain states:

1. A high gain mode in which the LNA is active with a full gain of G dB, which is typically between 10 and 20 dB. The high gain of the LNA results in the lowest noise figure (NF) for the receiver.

2. A low gain setting in which the LNA is bypassed, thus reducing the total gain by G dB but substantially increasing the NF.

Note that in the more general case, the LNA may have an adjustable gain control which ranges between these two extreme gain values thus providing combinations of gain/linearity and NF that are in between the combinations of values presented above.

As in receivers based on discrete components, and in RF integrated circuit design, a higher $3^{rd}$ order intercept point results in a high NF that could potentially degrade the performance of the receiver when weak signals are received. The first mixer state, which performs frequency downconversion in the front end of the receiver, typically follows a nominal LNA gain on the order of 15 dB. Therefore, in many cases the linearity of the receiver is limited by the $3^{rd}$ order intercept point of the first mixer that must handle an amplified signal.

The selection whether to place the LNA in low or high gain mode should be determined in accordance with the received strength of the desired signal. In the case when the interfering signal is present and the desired signal is strong enough, switching the LNA to a low gain setting will reduce the effects of the interfering signal. If, however, the desired signal is weak and requires the LNA's amplification, the gain of the LNA must be kept high.

Setting the gain of the LNA to high gain mode places a considerable limitation on the linearity of the receiver. The limitation on linearity of the receiver is due to the low $3^{rd}$ order intercept point of the first mixer stage. The reduction of LNA gain by 10 to 15 dB, intended to reduce the susceptibility of the receiver front end to nonlinear effects, causes an increase in the noise figure of the receiver and reduces its sensitivity. This is because the signals input to the mixer are not as strong as without the reduction in LNA gain. Consequently, the sensitivity of the receiver is reduced (the sensitivity is reduced as a consequence of an increase in the noise figure).

In some cases, it is not appropriate to switch the LNA to low gain mode. For example, in the case of near band high interference, the performance level of the receiver may fall below acceptable levels since the desired signal may be too low and the near band interference signal too high. In this case, the improvement of linearity is achieved at the expense of receiver sensitivity. Further, in some cases, switching the LNA to a low gain mode of operation does not result in a significant enough improvement of the linearity of the receiver.

SUMMARY OF THE INVENTION

The present invention overcomes the problems and disadvantages of the prior art by providing an apparatus for and method of extending the dynamic range of a RF communications receiver. The invention is operative to provide a control mechanism for controlling the gain of both the LNA and down conversion mixer in the front end portion of an RF receiver. In one alternative embodiment, the LNA is adapted to comprise two gain settings, i.e., a low gain setting and a high gain setting, in addition to the mixer having two gain modes. The control mechanism comprises a two bit gain control that places both the LNA and mixer in one of four operating gain mode states. The selection of the most appropriate operating gain mode state from among the four available, is preferably determined in accordance with the received levels of the desired signal and any interference signal present.

By adapting the mixer to have two gain states, the flexibility of the RF receiver is greatly improved with respect to the tradeoff between sensitivity and linearity described above in the Background section. For example, when the mixer is set to the low gain mode of operation while the LNA is set to the high gain mode of operation, the sensitivity of the RF receiver is greatly improved without sacrificing receiver linearity as compared to the response of the receiver when the gain of the LNA is set low and the gain of the mixer is set high. Since the major affect on the linearity of the receiver is the linearity of the mixer, setting the mixer to a low gain state improves the linearity of the receiver to a greater extent that when the LNA is set to low gain mode and the mixer to high gain mode.

The selection of the most appropriate operating gain mode state from among the four available, is preferably determined in accordance with various metrics such as the received levels of the desired signal, levels of interference signals, bit error rate and receiver RSSI.

There is therefore provided in accordance with the present invention a communications receiver comprising a low noise amplifier (LNA) for amplifying a received signal so as to generate an LNA output signal, the LNA having M gain setting modes of operation, the gain of the LNA determined in response to an LNA gain control command having a plurality of $\log_2 M$ control lines wherein M is a positive integer, a mixer for multiplying the LNA output signal with a local oscillator signal so as to generate a mixer output signal, the mixer having N gain setting modes of operation, the gain of the mixer determined in response to a mixer gain control signal command having a plurality of $\log_2 N$ control lines wherein N is a positive integer, a detector for recovering, from the mixer output signal, information originally transmitted and a controller operative to generate the gain control command to the LNA and the mixer gain control command to the mixer, the controller adapted to set the gain setting of the LNA and of the mixer to one of a plurality of gain states, wherein each gain state consists of a unique combination of LNA gain setting and mixer gain setting.

There is also provided in accordance with the present invention a communications receiver comprising a low noise amplifier (LNA) for amplifying a received signal so as to generate an LNA output signal, the LNA having a low gain and a high gain mode of operation, the gain of the LNA determined in response to an LNA gain control command, a mixer for multiplying the LNA output signal with a local oscillator signal so as to generate a mixer output signal, the mixer having a low gain and a high gain mode of operation, the gain of the mixer determined in response to a mixer gain control command, a detector for recovering, from the mixer output signal, information originally transmitted and a controller operative to generate the LNA gain control command and the mixer gain control command, the controller adapted to set the gain setting of the LNA and of the mixer to one of four gain states, wherein each gain state consists of a unique combination of LNA gain setting and mixer gain setting.

There is still further provided in accordance with the present invention a method of controlling the gain of a Low Noise Amplifier (LNA) and a mixer in a communication receiver, the method comprising the steps of providing an LNA circuit adapted to have at least two gain settings, namely a low gain mode of operation and a high gain mode of operation, providing a mixer circuit adapted to have at least two gain settings, namely a low gain mode of operation and a high gain mode of operation, setting the LNA to low gain mode and the mixer to low gain mode to achieve maximum linearity, maximum $3^{rd}$ order intercept point and minimum sensitivity, setting the LNA to low gain mode and the mixer to high gain mode to improve linearity while reducing sensitivity, setting the LNA to high gain mode and the mixer to low gain mode to achieve greater linearity and higher $3^{rd}$ order intercept point without substantially reducing sensitivity and setting the LNA to high gain mode and the mixer to high gain mode to achieve maximum sensitivity.

There is also provided in accordance with the present invention a communications receiver comprising a low noise amplifier (LNA) for amplifying a received signal so as to generate an LNA output signal, the LNA having a low gain and a high gain mode of operation, the gain of the LNA determined in response to an LNA gain control signal, a mixer for multiplying the LNA output signal with a local oscillator signal so as to generate a mixer output signal, the mixer having a low gain and a high gain mode of operation, the gain of the mixer determined in response to a mixer gain control signal, a detector for recovering, from the mixer output signal, information originally transmitted, a controller adapted to switch the receiver into any of four states via the LNA gain control signal and the mixer gain control signal, the states corresponding to the combination of low and high gain modes of the LNA and the mixer and wherein the controller is operative to initialize the receiver to a high sensitivity state wherein the LNA and the mixer are set to a high gain mode of operation and switching to a state having lower sensitivity in response to low correlation of the signal output of the detector with an expected signal.

In addition, there is provided in accordance with the present invention a communications receiver coupled to a communications channel comprising a low noise amplifier (LNA) for amplifying a received signal so as to generate an LNA output signal, the LNA having a low gain and a high gain mode of operation, the gain of the LNA determined in response to an LNA gain control signal, a mixer for multiplying the LNA output signal with a local oscillator signal so as to generate a mixer output signal, the mixer having a low gain and a high gain mode of operation, the gain of the mixer determined in response to a mixer gain control signal, a detector for recovering, from the mixer output signal, information originally transmitted, monitoring means for monitoring the error rate at the output of the receiver so as to estimate the quality of the channel, a controller adapted to switch the receiver into any of four states via the LNA gain control signal and the mixer gain control signal, the states corresponding to the combination of low and high gain modes of the LNA and the mixer and wherein the controller is operative to set the state of the receiver from a previous state to a new state in accordance with the current error rate measured by the monitoring means, switch the receiver back to the previous state if the error rate obtained in the new state is worse than that obtained in the previous state.

There is also provided in accordance with the present invention a communications receiver coupled to a communications channel comprising a low noise amplifier (LNA) for amplifying a received signal so as to generate an LNA output signal, the LNA having a low gain and a high gain mode of operation, the gain of the LNA determined in response to an LNA gain control signal, a mixer for multiplying the LNA output signal with a local oscillator signal so as to generate a mixer output signal, the mixer having a low gain and a high gain mode of operation, the gain of the mixer determined in response to a mixer gain control signal, a detector for recovering, from the mixer output signal, information originally transmitted, first monitoring means for monitoring the error rate of the receiver so as to estimate the quality of the channel, second monitoring means for measuring a received signal strength indicator (RSSI) signal of the receiver, a controller adapted to switch the receiver into any of four states via the LNA gain control signal and the mixer gain control signal, the states corresponding to the combination of low and high gain modes of the LNA and the mixer and wherein the controller is operative to set the state of the receiver to a low gain state in response to a high RSSI reading and a high error rate, leave the state of the receiver in a high gain state in response to low RSSI reading and a high error rate.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document.

| Term | Definition |
|------|------------|
| BER | Bit Error Rate |
| BPF | Band Pass Filter |
| CMOS | Complementary Metal Oxide Semiconductor |
| FET | Field Effect Transistor |
| FM | Frequency Modulation |
| FSK | Frequency Shift Keying |
| HEMT | High Electron Mobility Transistor |
| IC | Integrated Circuit |
| IF | Intermediate Frequency |
| IP3 | 3$^{rd}$ Order Intercept Point |
| ISM | Industrial Scientific Medial |
| LNA | Low Noise Amplifier |
| LO | Local Oscillator |
| MESFET | Metal Semiconductor Field Effect Transistor |
| NF | Noise Figure |
| NMOS | N-Type Metal Oxide Semiconductor |
| PHEMT | Pseudomorphic Hetero Junction Field Effect Transistor |
| PLL | Phase Lock Loop |
| RF | Radio Frequency |
| RSSI | Received Signal Strength Indication |
| SCO | Synchronous Connection Oriented link |
| VCO | Voltage Controlled Oscillator |

Description of the Invention

The present invention comprises an apparatus for and method of extending the dynamic range of a RF communications receiver. The invention functions to provide a control mechanism for controlling the gain of both the LNA and down conversion mixer in the front end portion of an RF receiver.

Figure 1:
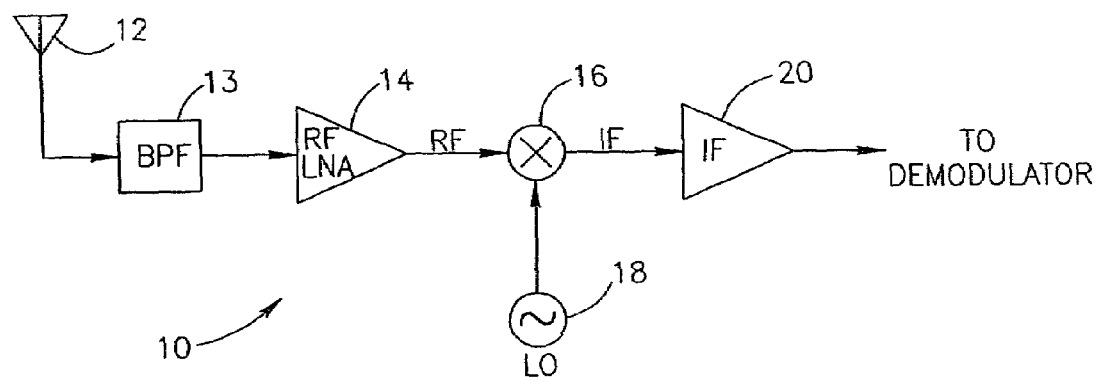
FIG. 1 is a block diagram illustrating a conventional prior art superheterodyne receiver front end.
Figure 2:
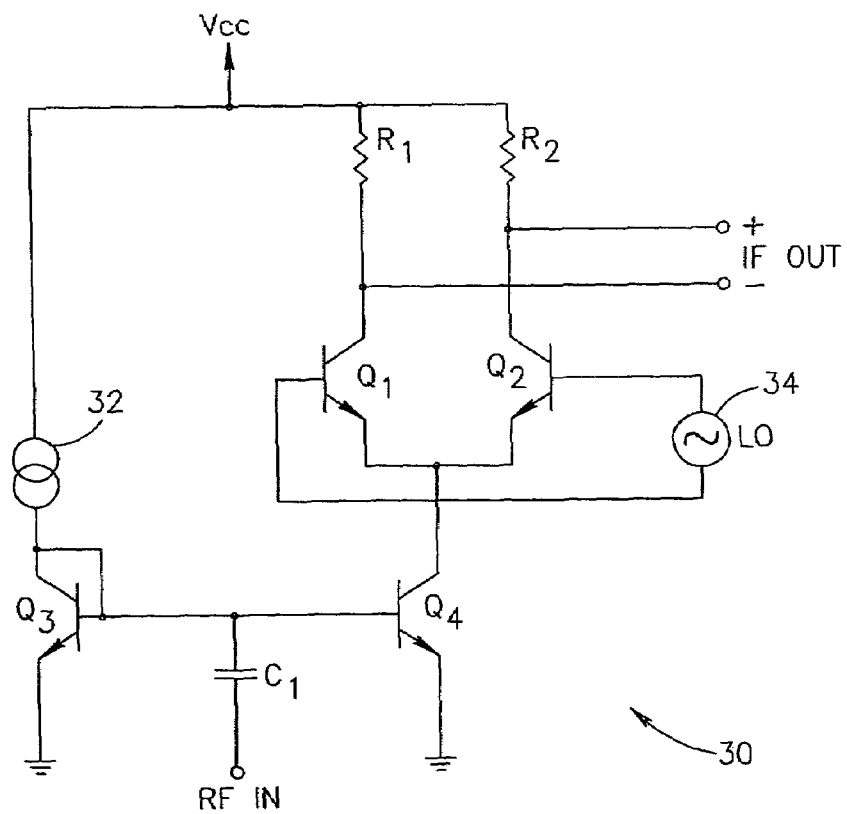
FIG. 2 is a schematic diagram illustrating a typical prior art mixer circuit.
Figure 3:
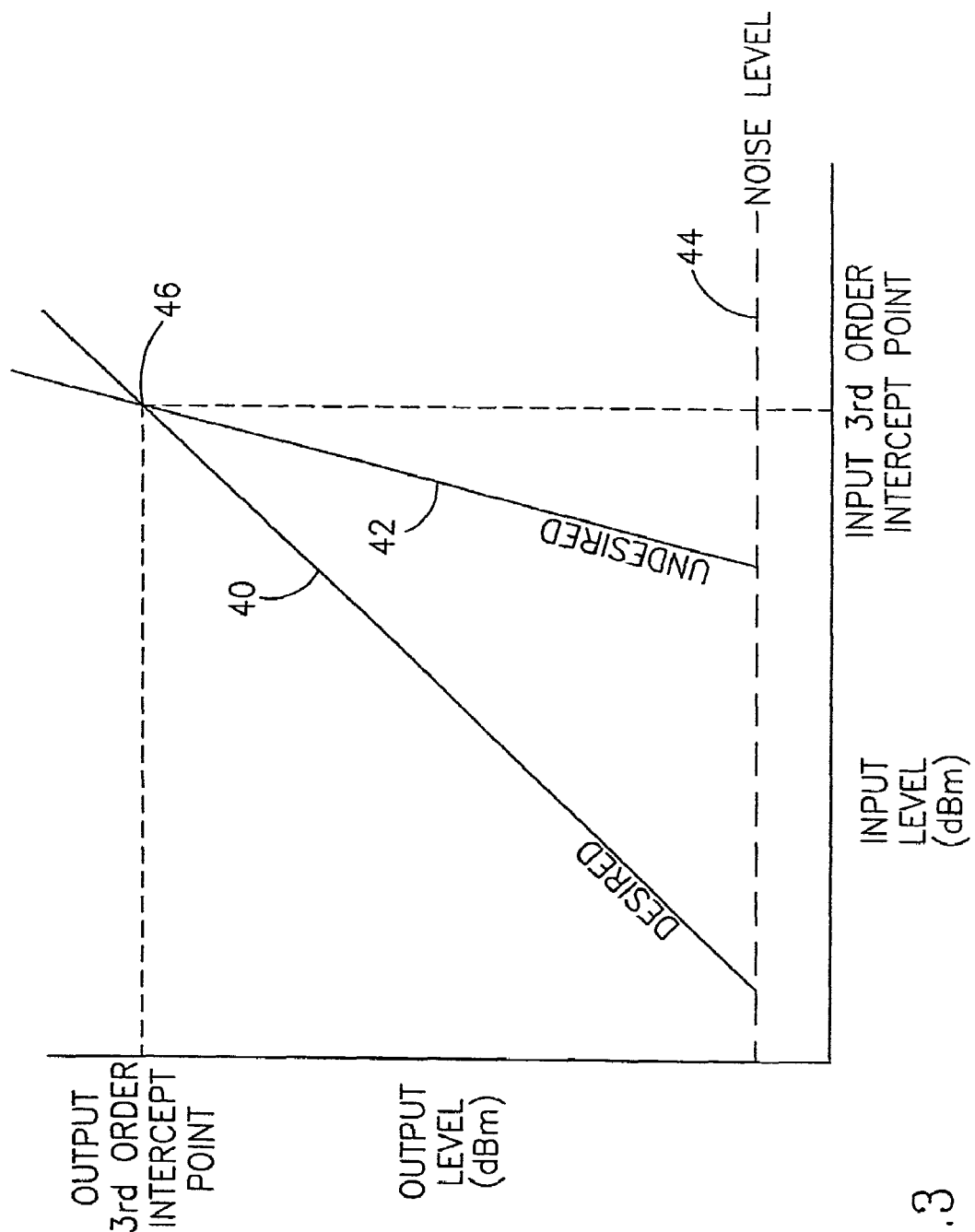
FIG. 3 is a graph illustrating the third order intercept point for a mixer.
Figure 4:
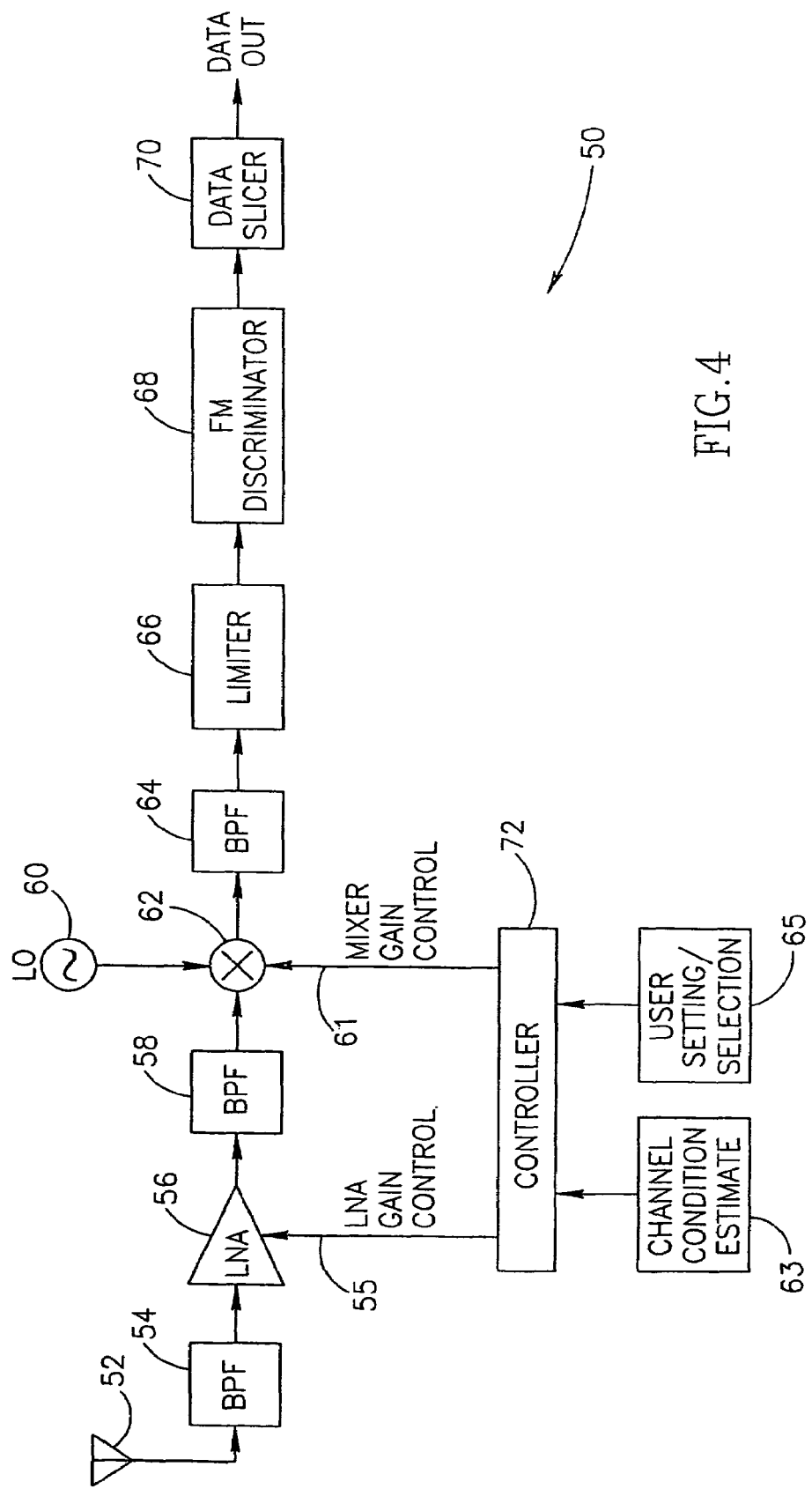
FIG. 4 is a block diagram illustrating an example RF receiver circuit incorporating a variable gain LNA and mixer constructed in accordance with the present invention.

A block diagram illustrating an example RF receiver circuit incorporating a variable gain LNA and mixer constructed in accordance with the present invention is shown in FIG. 4. To aid in illustrating the principles of the present invention, the invention is described in the context of an example FSK receiver, such as may be constructed for use in a Bluetooth compatible receiver. Note, however, it is not intended that the invention be limited to the example shown herein. As is well known to those skilled in the communication arts, the present invention may be applied to numerous other types of receivers as well, which are considered to fall within the spirit and scope of the present invention.

The receiver, generally referenced 50, comprises an antenna 52, band pass filters 54, 58, 64, LNA 56, mixer 62, local oscillator 60, limiter 66, FM discriminator 68, data slicer 70 and a controller 72. The front end portion of the receiver comprises the antenna and the first RF amplifier stage including the band pass filter 54 and Low Noise Amplifier (LNA) 56. The signal from the antenna 52 is input to the band pass filter 54 which is adapted to pass the desired band of frequencies, e.g., the 100 MHz band of channels in the 2.4 GHz Industrial, Scientific and Medial (ISM) band.

The output of the band pass filter is input to the LNA 56 that is adapted to have at least two different gain settings. In this example embodiment, the LNA is adapted to have two gain settings: a low gain setting and a high gain setting. The gain of the LNA is set by an LNA gain control signal 55 that is generated and provided by the controller 72.

Note that the front end is typically one of the most critical portions of a receiver, since the sensitivity of the entire receiver is usually dominated by the sensitivity of the front end. It is therefore preferable to use a low noise, high gain front end that can provide a good signal for the remainder of the receiver. The noise generated in the front end of a receiver itself, is amplified by the succeeding stages. In addition, it is preferable that the front end be as linear as possible. The more nonlinear the front end, the more susceptible the front end is to the generation of mixing products resulting from the interference present at the receiver input.

The output of the LNA is input to a second band pass filter 58. Both band pass filters are relatively wideband since they must pass all possible channels of the ISM band to the mixer 62. Similar to BPF 54, the bandwidth of the filter 58 is adapted to be approximately 100 MHz in the 2.4 GHz ISM band, i.e., from 2.4 to 2.5 GHz. Depending on the environment of the receiver, there may be large amounts of noise and undesirable signals present at the input to the mixer, such as those generated by microwave ovens and other wireless transmission signal sources.

The mixer functions to downconvert the received RF signal to an IF frequency. The mixer is a nonlinear circuit element that combines the signal with the local oscillator to produce the sum and difference frequencies in addition to a plurality of undesired signals. A particular channel is selected by adjusting the local oscillator signal 60 to the appropriate frequency. Thus, the LO and mixer provide the channel selection functions for the RF receiver 50. In accordance with the present invention, the mixer is adapted to comprise at least two gain settings. In the example embodiment presented herein, the mixer is adapted to have two gain states, i.e., a low gain setting and a high gain setting. The mixer gain is set by a mixer gain control signal 61 generated and provided by the controller 72. Note that alternatively, the band pass filter 58 can be eliminated and an image-reject mixer used instead.

The controller 72 is adapted to receive estimates 63 of the condition of the channel in addition to receiving the settings and selections 65 made by the user.

The output of the mixer is filtered by a channel filter 64 which comprises a band pass filter which, unlike band pass filters 54, 58 is constructed to have a very narrow bandwidth. Thus, the channel selectivity is provided by the mixer in combination with band pass filter 64. The signal output of the filter 64 is passed through the limiter 66 before being input to the FM discriminator 68. The limiter functions to eliminate the sensitivity of the discriminator to fluctuations in the amplitude of the signal.

The discriminator functions to extract the information from the signal represented as frequency deviations therein. In particular, it produces an output voltage whose amplitude varies in response to the instantaneous signal frequency. The output is zero (or a known DC level) for a signal at the center of the pass band. Deviations of the signal frequency cause the output voltage to either increase or decrease depending on the direction of the frequency deviation.

The signal output of the FM discriminator is input to the data slicer 70 which functions to decide whether the signal represents a zero bit or a one bit. The data slicer comprises a decision circuit that converts the baseband signal output of the discriminator 68 into a stream of data bits. Preferably, the data slicer performs this conversion such that the content of the output data bits match closely as possible the content of the original transmitted data.

The noise figure for the receiver as a whole depends on the noise figures for the individual components making up the receiver. In general, the equivalent noise figure for the receiver can be expressed as $$NF_{EQUIV} = NF_{LNA} + \frac{NF_{BPF} - 1}{G_{LNA}} + \frac{NF_{MIX} - 1}{G_{LNA}G_{MIX}} + \ldots \quad (2)$$

where
- $NF_{EQUIV}$ is the equivalent noise figure of the system;
- $NF_{LNA}$ is the noise figure of the LNA;
- $NF_{BPF}$ is the noise figure of the band pass filter 58 situated before the mixer;
- $NF_{MIX}$ is the noise figure of the mixer;
- $G_{LNA}$ is the gain of the LNA; and
- $G_{MIX}$ is the gain of the mixer.

From the equation one can see that the equivalent noise figure rises when the gain of the LNA decreases. A much smaller effect on the equivalent noise figure can be achieved if the gain of the LNA is kept high while the gain of the mixer is lowered. Lowering the gain of the mixer has a much smaller effect on the equivalent noise figure than lowering the gain of the LNA. This is due to the mixer gain in the denominator of the third term in the equation. Lowering the gain of the mixer has the benefit of improving the linearity of the receiver. Thus, lowering the gain of the mixer while keeping the gain of the LNA high, results in an improvement of receiver linearity with only a minor impact on the noise figure of the receiver. This phenomena is described below in more detail in connection with the various gain states for the LNA and mixer.

In accordance with the present invention, the gain of both the LNA and mixer can be varied. The controller 72 generates the LNA and mixer gain control signals 55, 61 and outputs them to the LNA and mixer, respectively. In the example described herein, both the LNA and mixer gain control signals may take one of two states: either low or high gain. Thus, there are four possible states for the gain of the LNA and mixer, which can be represented using two bits. The four possible states are presented below in Table 1.

TABLE 1

LNA and Mixer Gain States

| State | LNA Gain Setting | Mixer Gain Setting |
|---|---|---|
| 00 | Low | Low |
| 01 | Low | High |
| 10 | High | Low |
| 11 | High | High |

The effect of each of the states on the sensitivity and linearity performance of the receiver is described in more detail below.

In the '00' state both the LNA and the mixer are set to low gain mode of operation. In this state, maximum linearity and minimum sensitivity are attained due to the reduced gain of the LNA and the mixer. The reduction in gain results in a maximum $3^{rd}$ order intercept point compared to the other three possible states. The $3^{rd}$ order intercept point is higher because the levels of any interfering signals are lowered due to the reduced gain of the LNA. Reducing the gain also maximizes the linearity of the LNA and the mixer. The tradeoff, however, is a higher noise figure for the receiver.

The '00' gain state mode of operation is particularly useful when a strong interference signal is present and the level of the desired signal is sufficiently strong to tolerate the reduction in gain. Note that in this state, the power consumption of the receiver may be reduced as a consequence of the low gain mode setting in the LNA and the mixer due to their reduced current consumption.

Note that in an alternative embodiment, the supply current to the receiver is increased. This serves to raise the IP3 in the presence of interference without sacrificing gain.

In the '01' state the LNA is set to low gain mode and the mixer is set to high gain mode. In this state, the linearity of the receiver is improved at the expense of reduced receiver sensitivity. Note that in this gain state, the amplitude of the signals arriving at the mixer is lower due to the reduced gain of the LNA. This results in a more linear output from the mixer but at the expense of a larger noise figure.

The '01' gain state mode of operation is particularly useful when the mixer is implemented as a passive mixer such as a double-balanced passive mixer constructed from four Schottky diodes arranged in a ring formation. Passive mixers, in general, are characterized as having relatively high $3^{rd}$ order intercept points. When using such a mixer, the limitation on $3^{rd}$ order intercept point is now due to the LNA. An advantage of this gain state mode is that power consumption can be reduced if the LNA is constructed to utilize less current in low gain mode of operation.

In the '10' state the LNA is set to high gain mode and the mixer is set to low gain mode. From among all four gain states, this state achieves the most improvement in the performance of the receiver. It is in this gain state, as compared with the other three, that the largest improvements in linearity are achieved without significant degradation to sensitivity.

Since the mixer is the major contributor to the non-linearity of the receiver, setting the mixer to a low gain mode of operation significantly improves the linearity of the receiver. Decreasing the gain of the mixer causes a significant increase in the $3^{rd}$ order intercept point. In addition, the sensitivity of the receiver in this gain state is not substantially degraded since the LNA, the dominant contributor to the receiver sensitivity, remains in the high gain mode of operation (the noise figure is not substantially changed in this gain state mode since the LNA dominates the noise figure of the receiver).

The '01' gain state mode of operation is particularly useful in a reduced power consumption state wherein the mixer is constructed to utilize less current in the low gain ode of operation.

In the '11' state both the LNA and the mixer are set to a high gain mode of operation. It is in this gain state mode of operation that maximum sensitivity at the expense of minimum linearity of the receiver are achieved. The increased sensitivity reduces the overall noise figure of the receiver. The high gain of the mixer, however, reduces the linearity to a minimum.

In the absence of any particular user command or command from an external management entity, the '11' gain state is typically the default gain state for the receiver to accommodate the system's maximal operating range (i.e. distance). When the system is setup to operate at much closer ranges, it may be preferable to select a different default. This gain state is particularly useful in applications wherein the linearity of the system is not a significant problem or concern. This may be the case when the input signal is relatively free of any interfering signals.

Figure 5:
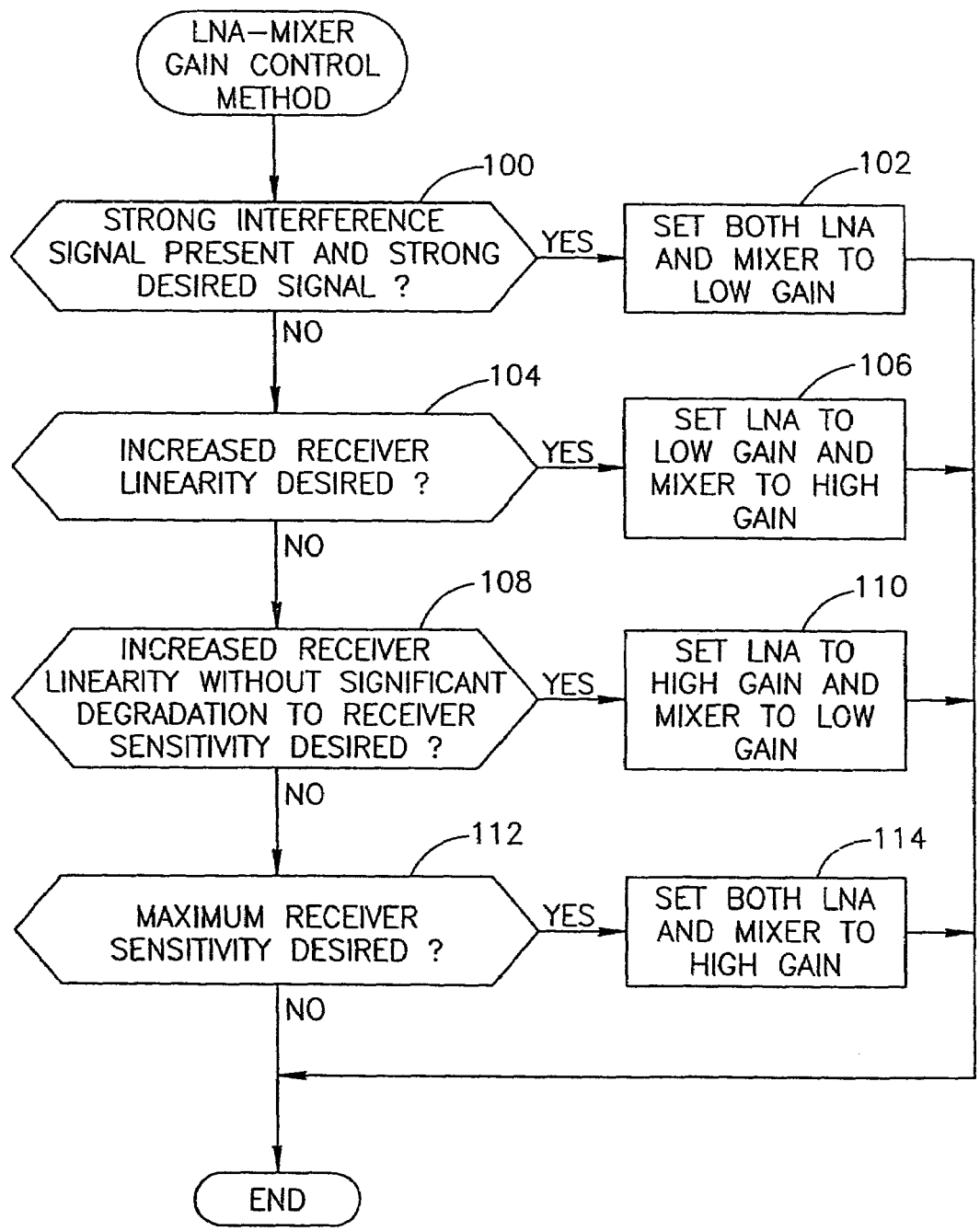
FIG. 5 is a flow diagram illustrating the method of determining the variable gain settings of both the LNA and mixer in the RF receiver.

A flow diagram illustrating the method of determining the variable gain settings of both the LNA and mixer in the RF receiver is shown in FIG. 5. The following method is one example method that may be implemented in the controller or other management entity to control the gain of the LNA and mixer portions of the receiver. The method presented herein may be modified and adapted by one skilled in the electrical and communication arts to match a particular application or operating environment.

The operation of the method requires a level of knowledge of the environment the receiver is operating in. For example, the signal strength of the desired signal and any significant interfering signals should be known. It is also preferable for the designer to have a particular goal relating to the desired sensitivity and linearity of the receiver.

If the desired signal is relatively strong while the interfering signals are also relatively strong (step 100), then both the LNA and the mixer are set to low gain mode of operation (step 102). This gain state corresponds to the '00' gain state whereby the linearity is maximized due to the low mixer gain setting. The sensitivity is reduced due to the reduced gain setting of the LNA thus reducing the effects of the interfering signals.

If it is desired to significantly increase the linearity of the receiver at the expense of sensitivity (step 104) than the LNA is set to low gain mode of operation while the mixer is set to high gain mode of operation (step 106). This gain state corresponds to the '01' gain state which is useful when the mixer is implemented as a passive mixer. Reduced power consumption may also be realized due to the lower gain of the LNA.

If it is desired to increase receiver linearity without significantly degrading receiver sensitivity (step 108) then the LNA is set to high gain mode of operation while the mixer is set to low gain mode of operation (step 110). This gain state corresponds to the '10' gain state whereby the linearity is improved due to the lower gain on the mixer while the sensitivity is relatively unchanged since the LNA is set to high gain mode. Reduced power consumption may also be realized due to the lower gain of the mixer.

If maximum receiver sensitivity is desired (step 112), than both the LNA and mixer are set to high gain mode of operation (step 114). This gain state corresponds to the '11' gain state whereby maximum sensitivity is achieved due to the high gain setting of the LNA and the mixer. The high gain of the front-end, however, reduces its linearity to a minimum.

Figure 6:
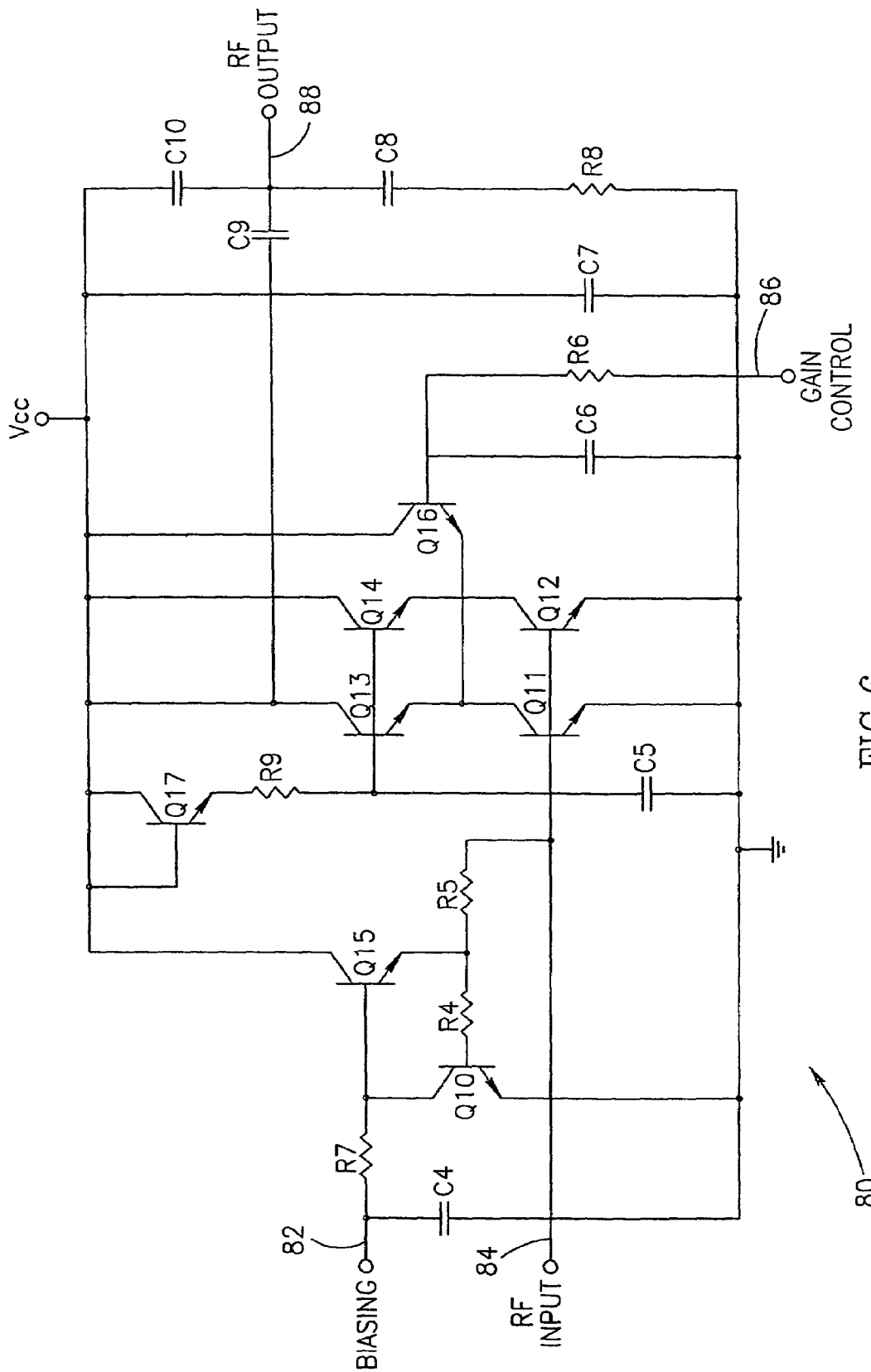
FIG. 6 is a schematic diagram illustrating in more detail an example variable gain LNA constructed in accordance with the present invention.

A schematic diagram illustrating in more detail an example variable gain LNA constructed in accordance with the present invention is shown in FIG. 6. The variable gain LNA circuit, generally referenced 80, comprises a biasing input 82, a signal input 84, gain control input 86 and an output signal 88. The bias input signal controls a biasing circuit comprising Q10, Q15, R7, R4, R5 and C4. The bias output signal is input to the bases of transistors Q11 and Q12. The gain control signal is input to the base of Q16 via R6. The emitter output of transistor Q17 drives the bases of Q13 and Q14 via R9. Note that the area of transistor Q11 is nearly 8 times that of Q12 while the area of Q13 is nearly 4 times that of Q14.

In high gain mode of operation, the gain control signal 86 is at ground potential. Transistor Q16 is cutoff, permitting current to flow through Q13 and Q11 enabling the output. The RF signal flows through transistors Q11, Q13 to the output with bias current generated by Q10, Q15.

In low gain mode of operation, the gain control input signal 86 is at high potential ($V_{CC}$). Transistor Q16 conducts creating a path to $V_{CC}$ at the collector of Q11. This effectively grounds the collector signal for the RF signals. Most of the RF signal is bypassed through Q16 to $V_{CC}$ which is effectively RF ground. A small amount of current still flows, however, through transistors Q14 and Q12 which have smaller areas than Q13 and Q11. Thus, the gain of the LNA is reduced to a low value and is not zero. The ratio of the areas of transistors Q11, Q12 and Q13, Q14 determine the magnitude of the low gain setting of the LNA.

Note that in this example implementation of the variable gain LNA circuit, the magnitude of the gain in the high gain mode is approximately 15 dB while the magnitude of the gain in the low gain setting is approximately −2 dB. Note also that in this particular variable gain LNA circuit, reducing the gain of the LNA does not raise the $3^{rd}$ order intercept point. Reducing the gain of the LNA does not increase its linearity. The linearity of the overall system, however, is improved since a smaller amplitude signal is input to the mixer. The improvement in linearity is achieved regardless of the gain setting of the mixer. Reducing the amplitude of the signal input to the mixer improves its linearity and thus, the linearity of the overall system.

Figure 7:
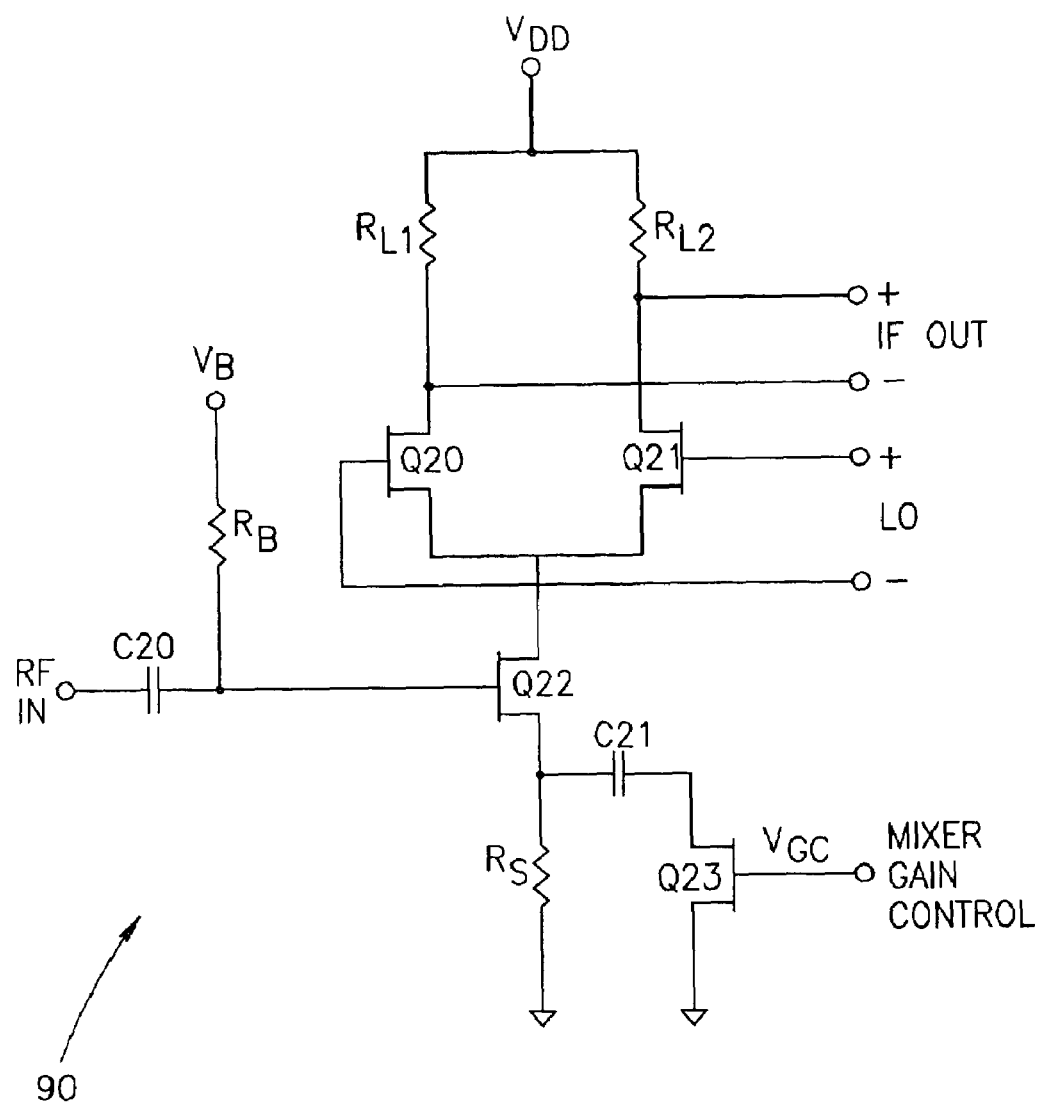
FIG. 7 is a schematic diagram illustrating in more detail an example variable gain mixer constructed in accordance with the present invention.

A schematic diagram illustrating in more detail an example variable gain mixer constructed in accordance with the present invention is shown in FIG. 7. The mixer circuit, generally referenced 90, comprises a mixer core implemented using FETs and a variable gain circuit for adjusting the gain of the mixer. The mixer comprises an RF input (RF IN), local oscillator input (LO), IF output (IF OUT), biasing input $V_B$ and a mixer gain control input $V_{GC}$.

In operation, a differential local oscillator signal is applied to the gates of FETs Q20 and Q21. The RF IN input signal is applied to the gate of FET Q22 through capacitor C20. The IF output is differentially collected from load resistors $R_{L1}$ and $R_{L2}$. The voltage $V_B$, the biasing voltage for Q22, is applied to the base of Q22 via resistor $R_B$. The biasing voltage $V_B$ determines the current that flows through the mixer. The gain control voltage $V_{GC}$ is applied to the gate of Q23.

Transistor Q23 preferably comprises an N-channel CMOS or enhancement GaAs MESFET. In this case, the channel resistance can be varied by varying the voltage applied to the gate. If $V_{GC}$ is less than $V_{PO}$ (the pinch off voltage) then $R_{DS}$ (the channel resistance) is very high and the RF equivalent source resistance of Q22 is essentially the resistance $R_S$. The RF voltage is divided between the gate source junction of Q22 and resistor $R_S$. Note that $R_S$ is preferably in the range of 100 to 1K Ω. In this case, the conversion gain of the mixer is low and the input $3^{rd}$ order intercept point (IIP3) is high.

If, on the other hand, the gain control input voltage $V_{GC}$ is high (i.e., higher than the pinch off voltage $V_{PO}$), then the channel resistance $R_{DS}$ becomes low (e.g., a few Ohms) and the RF equivalent resistance comprises $R_S$ in parallel with $R_{DS}$. The parallel combination $R_S$ in parallel with $R_{DS}$ is approximately $R_{DS}$ when the channel resistance is a low value such as a few Ohms. In this case, the conversion gain of the mixer is increased to a high value while the input $3^{rd}$ order intercept point (IIP3) is lowered.

A key feature of the variable gain control mixer circuit of the present invention is that in both high gain and low gain modes of operation, the current flowing through the mixer remains constant. The increase in the IIP3 in the low gain setting of the mixer is due to the constant current flow through the mixer. By comparison, if the mixer gain control is realized by a reduction in current, the IIP3 will consequently also be lowered.

It is important to note that the mixer circuit 90 can be realized in any suitable commercially available semiconductor process technology. For example, the mixer may be realized using well known CMOS technology (using NMOS FETs) or BiCMOS technology. In an alternative embodiment, transistors Q20, Q21, Q22 are replaced with bipolar transistors and Q23 may be implemented using well known and commercially available NMOS, GaAs MESFET, HEMT, PHEMT semiconductor technology. In this case, transistors Q20, Q21, Q22 and Q23 may comprise N-channel depletion FETs, enhancement FETs or a combination comprising Q20, Q21, Q22 as depletion FETs and Q23 as enhancement FET.

Alternatively, one skilled in the electrical arts may implement the variable gain control technique of the present invention in numerous other mixers as well, both passive and active mixer types, by appropriately introducing the network of resistor $R_S$, capacitor C21 and transistor Q23 to the mixer circuit.

In the case of a FET (as is shown in FIG. 7) the network of resistor $R_S$, capacitor C21 and transistor Q23 is applied to the source of the FET that the RF input signal is applied to. Alternatively, in the case of a bipolar transistor, the network of resistor $R_S$, capacitor C21 and transistor Q23 is applied to the emitter of the bipolar transistor to which the RF signal is applied to its base.

Figure 8:
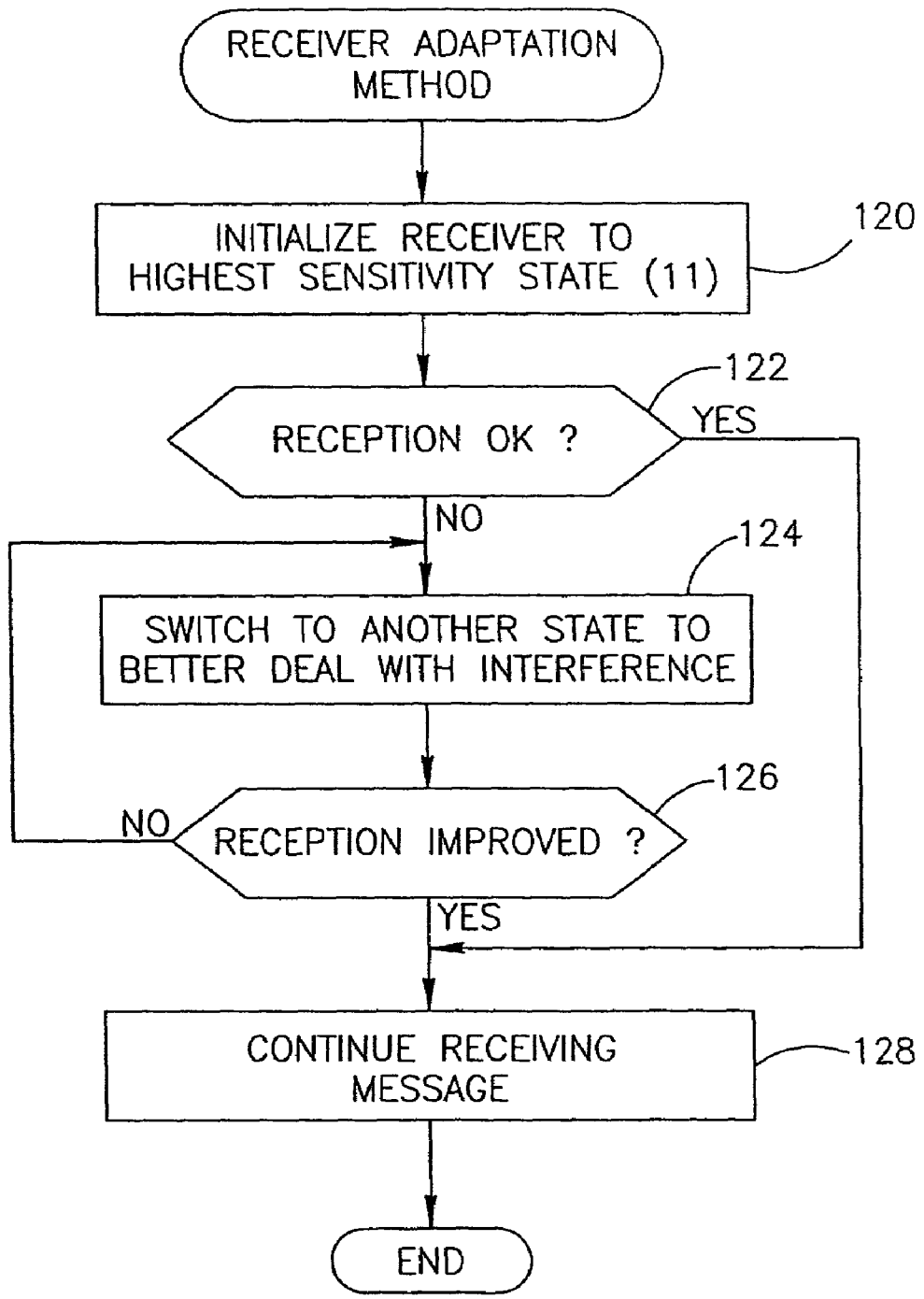
FIG. 8 is a flow diagram illustrating the receiver adaptation method of the present invention.

An example application of the control mechanism of the present invention to control the performance in a communications receiver will now be presented. A flow diagram illustrating the receiver adaptation method of the present invention is shown in FIG. 8. Initially, the receiver is placed in the high sensitivity state (state 11 in Table 1) while awaiting the reception of a message (or packet, frame, etc.) (step 120).

Note that it is assumed that the receiver has knowledge of the timing of an arriving packet which is the case in many communications systems, such as a Bluetooth compatible system using an Synchronous Connection Oriented (SCO) link. The SCO link is a symmetric, point to point link between a master and slave device. The master uses reserved slots at regular known intervals to support time-sensitive information such as voice.

If the preamble or a portion thereof is detected correctly (step 122), the receiver may decide to continue to remain in this state (i.e. high sensitivity state 11) throughout the remainder of the packet, including the payload (step 128). Alternatively, the receiver may switch to a different state in order to reduce the gain of either the LNA or the mixer.

If, however, the reception is poor, i.e. the correlation of the received data (e.g., preamble) with the expected data is lower than a certain level, and if an optional timeout has passed, then the receiver can attempt to improve reception by switching to a different state (step 124). If the correlation is poor due to a weak signal, then switching to a different state will not help since the receiver is already in the state with the highest sensitivity.

If, however, the correlation is poor because of interference, then switching to a state where gain is sacrificed but interference is dealt with better can improve reception. For example, switching to a state with lower gain may permit the desired signal to be properly recovered at the demodulator if the reception problem was caused by intermodulation products overpowering the signal.

If the reception is improved (step 126), the receiver remains in the current state for the remainder of the packet (step 128). If reception has not improved, then the receiver can switch to another state (e.g., low sensitivity for the LNA and mixer—state 00) that the receiver can achieve better reception with (step 124). Note that preferably the preamble of the packet is sufficiently long enough to permit the receiver to switch states one or more times in the event reception is poor, without sacrificing payload data. The reception quality can be determined, for example, based on the counting of errors in the received data.

More generally, a particular metric or a combination of metrics may be monitored to obtain an evaluation of the link quality. The monitored link quality is then used to determine the appropriate state for the receiver to operate in. For example, in continuous data systems incorporating error control (e.g., block coding, symbol coding, etc.), the error rate may be continuously or periodically monitored and used as a means for evaluating the link quality.

In such a system, the state is selected based on an estimate regarding the level of interference. Once a different state is selected, due to a change in the estimate, a determination is then made whether the current state is better or worse than the previous state in accordance with an increase or decrease in channel errors. Note that this assumes the level of the desired signal remains substantially constant throughout the comparison (which may not be the case for a wireless system wherein the transmitter or receiver is in motion and the comparison time is exceedingly long).

In another embodiment, the signal strength readings from a receiver's received signal strength indication (RSSI) are used in determining the appropriate operating state for the receiver. If the RSSI is high, but the quality is poor in terms of another metric such as bit error rate (BER) then it is assumed that large amounts of interference are present and the gain should be reduced. If a poor BER is accompanied by a very low RSSI reading, it is assumed that interference is not a problem and the receiver front-end is to remain in the high gain state.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A communications receiver, comprising:
    a low noise amplifier (LNA) for amplifying a received signal so as to generate an LNA output signal, said LNA having M gain setting modes of operation, the gain of said LNA determined in response to an LNA gain control command having a plurality of $\log_2 M$ control lines, wherein M is a positive integer;
    a mixer for multiplying said LNA output signal with a local oscillator signal so as to generate a mixer output signal, said mixer having N gain setting modes of operation, the gain of said mixer determined in response to a mixer gain control signal command;
    a detector for recovering, from said mixer output signal, information originally transmitted, said detector comprising:
    a limiter adapted to limit the amplitude swing of a signal input thereto;
    a discriminator adapted to generate an output voltage proportional to frequency deviations in the output of said limiter; and
    a data slicer operative to apply a threshold to the output voltage of said discriminator so as to recover digital data therefrom; and
    a controller operative to generate said gain control command to said LNA and said mixer gain control command to said mixer, said controller adapted to set the gain setting of said LNA and of said mixer to one of a plurality of gain states, wherein each gain state consists of a unique combination of LNA gain setting and mixer gain setting.

2. The receiver according to claim 1 wherein M is two.

3. The receiver according to claim 1 wherein said mixer gain control command comprises a plurality of $\log_2 N$ control lines, where N is a positive integer.

4. The receiver according to claim 1 where N is two.

5. The receiver according to claim 1, further comprising a band pass filter located before said mixer and adapted to filter the LNA input signal before input to said mixer.

6. The receiver according to claim 1 further comprising a band pass filter located before said mixer and adapted to filter the LNA output signal before input to said mixer.

7. The receiver according to claim 1, further comprising a band pass filter located after said mixer and adapted to filter said mixer output.

* * * * *